United States Patent
Braun et al.

(10) Patent No.: US 9,553,022 B1
(45) Date of Patent: Jan. 24, 2017

(54) METHOD FOR USE IN MANUFACTURING A SEMICONDUCTOR DEVICE DIE

(71) Applicant: Infineon Technologies AG, Neubiberg (DE)

(72) Inventors: Michaela Braun, Regensburg (DE); Markus Menath, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 11 days.

(21) Appl. No.: 14/792,419

(22) Filed: Jul. 6, 2015

(51) Int. Cl.
| | |
|---|---|
| H01L 21/00 | (2006.01) |
| H01L 21/78 | (2006.01) |
| H01L 21/66 | (2006.01) |
| H01L 23/31 | (2006.01) |
| H01L 21/683 | (2006.01) |
| H01L 21/3065 | (2006.01) |

(52) U.S. Cl.
CPC ........... *H01L 21/78* (2013.01); *H01L 21/3065* (2013.01); *H01L 21/6835* (2013.01); *H01L 21/6836* (2013.01); *H01L 22/34* (2013.01); *H01L 23/3121* (2013.01); *H01L 2221/68327* (2013.01)

(58) Field of Classification Search
CPC ........................................................ H01L 21/00
See application file for complete search history.

(56) References Cited

U.S. PATENT DOCUMENTS

2012/0161308 A1* 6/2012 Chu ................. H01L 21/561
257/692

* cited by examiner

*Primary Examiner* — Marvin Payen
(74) *Attorney, Agent, or Firm* — Slater Matsil, LLP

(57) ABSTRACT

In one embodiment, a wafer includes a number of die areas each including a semiconductor device and dedicated to become a separate die. The die areas are disposed on a first face of the wafer and wherein adjacent die areas are distanced from one another. A first trench and a second trench are formed on the first face between adjacent die areas. The first trench and the second trench are spaced apart from one another by a ridge. A third trench is disposed above the ridge on a second face of the wafer.

13 Claims, 9 Drawing Sheets

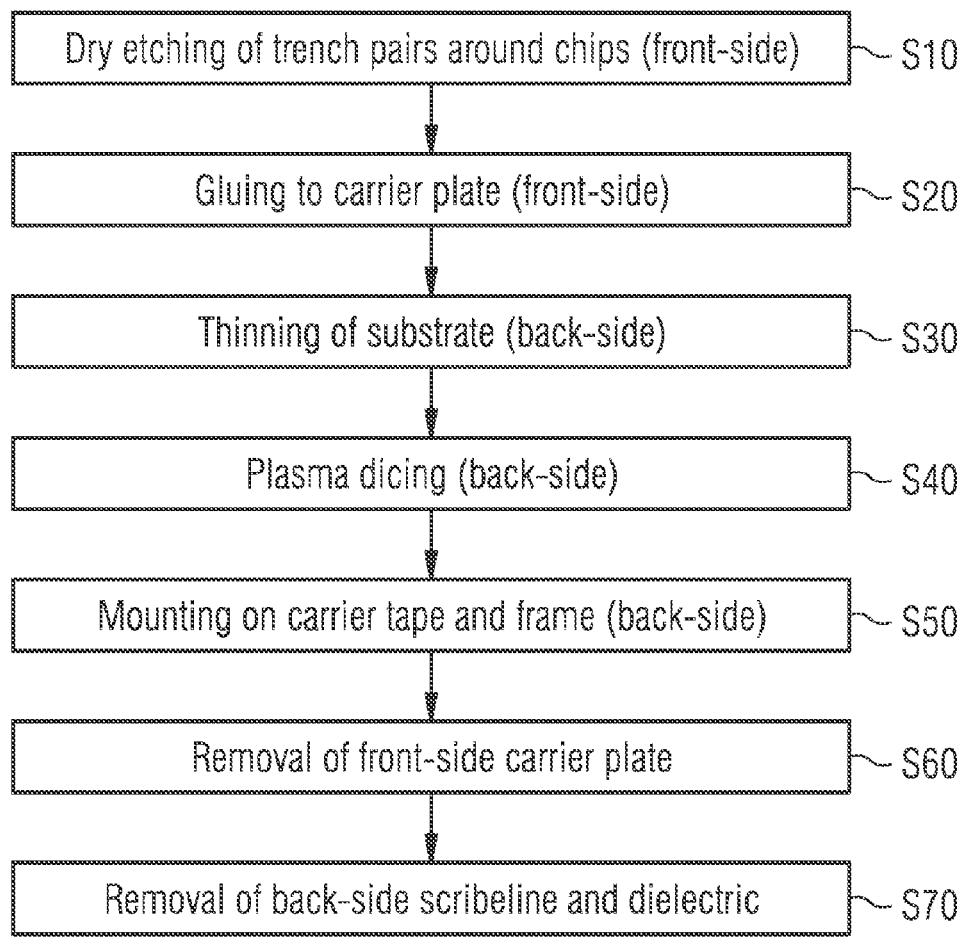

METHOD FOR USE IN MANUFACTURING A SEMICONDUCTOR DEVICE DIE

TECHNICAL FIELD

The present disclosure relates to manufacture of semiconductor devices such as integrated circuits.

BACKGROUND

Many semiconductor devices are made from silicon crystals. Typically, the crystal is cut into slices, so-called wafers. During processing of a wafer, multiple instances of semiconductor devices, for example, integrated circuits are formed on the wafer. Each semiconductor device such as each integrated circuit defines an active area on the wafer. While the wafer is destined to be divided into a plurality of dice as separate semiconductor products, the dice, or "dice-to-be", define separate die areas on the wafer that each can include one or more active areas. Herein, for simplicity, an active area will also be referred to as die area or chip area; it should however be understood a die area or chip area may include a plurality of semiconductor devices such as several integrated circuits within one active area or located in several active areas. Thus, multiple die areas are created on the wafer.

In a later step in processing the wafer, wafer material is removed from some of the spaces between die areas, whereby trenches are formed in the wafer, along so-called scribe lines. Typically, the multiple die areas provided on the wafer are eventually separated from one another by breaking, sawing, or cutting the wafer along the scribe lines to form so-called dice that respectively comprise a semiconductor device such as an integrated circuit.

Wafer dicing is a process by which dice are separated from a wafer of semiconductor following the processing of the wafer. The dicing process can be accomplished by scribing and breaking, by mechanical sawing, by dicing after grinding, by etching or by laser cutting. The dice are, for example, each set to a die frame that holds the dice during further steps of manufacturing the circuit chips. Following the dicing process the individual silicon chips are encapsulated into and/or provided onto chip carriers such as packages, printed circuit boards, component housings, and the like, which are then suitable for use in building electronic devices such as computers, etc.

Typically, in addition to the semiconductor devices such as integrated circuits formed on the dice, herein also referred to as "die-semiconductor devices" and "die-integrated circuit", respectively, other structures are formed on the wafer, for example, for use in wafer testing, for example other circuitry. Eventually, e.g., in a finished integrated chip product, the other structures such as circuitry can be dispensed with. The other structures, herein also referred to as "wafer-circuitry", can be allocated in scribe line portions of the wafer. Allocating the wafer-circuitry in a scribe line portion can be problematic, though, since not every method of separating the dice-to-be of the wafer so as to form dice can be performed with the other structure's metal elements and the wafer-circuitry's metal. In some solutions wafer-circuitry is disposed in dedicated portions of the wafer, also referred to as drop-in chips. As the name suggests, drop-in chips cannot also be used to yield semiconductor device products.

SUMMARY

In an aspect, disclosed herein is a method for use in manufacturing semiconductor devices. The method comprises providing a wafer comprising a plurality of die areas that are formed on a first face of the wafer to become a separate die. Adjacent die areas are distanced from one another. The method further comprises, on the first face, between adjacent die areas, forming a first trench and a second trench spaced apart from one another by a ridge, and, on a second face of the wafer, forming a third trench above the ridge.

In another aspect, an apparatus for use in manufacturing semiconductor devices is disclosed. In some implementations the apparatus is configured to hold a wafer comprising a plurality of die areas each to become a separate die. In some embodiments, the die areas are formed on a first face of the wafer. Adjacent die areas are distanced from one another. The wafer further comprises, on the first face, between adjacent die areas, a first trench and a second trench that are spaced apart from one another by a ridge. In some implementations the apparatus is configured to form, on a second face of the wafer, a third trench above the ridge.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention.

FIG. 9 is a diagram that illustrates an exemplary flow of actions in a process according to some implementations.

Figure 1:
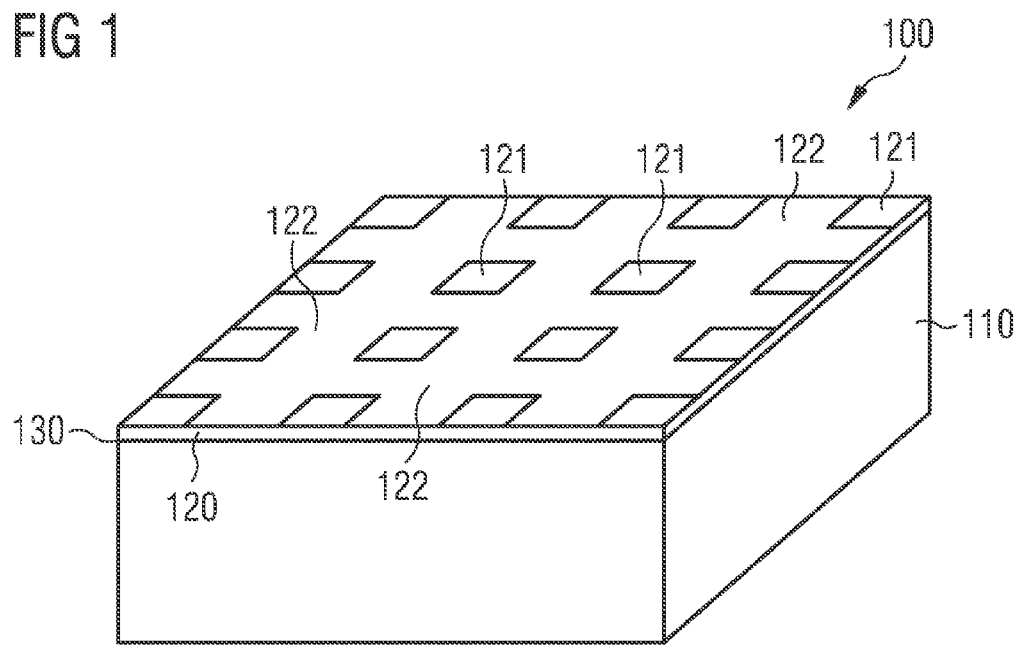
FIG. 1 is a diagram schematically illustrating a perspective view of a portion of a wafer to undergo processing using a method according to some embodiments.

The elements of the drawings are not necessarily to scale relative to each other. As used herein, like terms refer to like elements throughout the description. Like reference numerals designate corresponding similar parts. Because components of embodiments according to the present invention can be positioned in a number of different orientations, directional terminology may be used for purposes of illustration that, however, is in no way limiting, unless expressly stated to the contrary. Other embodiments according to the present invention and many of the intended advantages of the present invention will be readily appreciated as they become better understood by reference to the following detailed description. It is to be understood that other embodiments may be utilized and structural or logical changes may be made without departing from the scope of the present invention. The following detailed description, therefore, is not to be taken in a limiting sense, and the scope of the present invention is defined by the appended claims.

DETAILED DESCRIPTION OF ILLUSTRATIVE EMBODIMENTS

Below, embodiments, implementations and associated effects are disclosed with reference to the accompanying drawings.

FIG. 1 is a diagram schematically illustrating a perspective view of a portion of a wafer 100 to undergo processing using a method according to some embodiments.

Wafer 100 comprises, for example, a plurality of integrated circuits that, in some embodiments, are destined to be each comprised in a separate integrated circuit chip as semiconductor device products. More particularly, in some embodiments the integrated circuits are destined to be provided each on a separate die so as to form the integrated circuit chip. Herein, such integrated circuits will also be referred to as die-integrated circuits as will be explained in more detail below. However, it should be understood that herein, while reference is made to integrated circuits, this reference is made merely to state examples. Techniques in accordance with the present disclosure can also be used in manufacturing other semiconductor devices formed on dice that may or may not include integrated circuits. Other semiconductor devices can be, for example, transistors, capacitances, inductances, mechanical devices, microelectromechanical systems (MEMS), etc. The techniques can be implemented where items commonly formed on a wafer, at some stage during manufacturing, are structurally separated from one another. For example, the techniques disclosed herein can be used in manufacturing discrete chips such as capacitances, transistors, inductances such as coils, MEMS and other devices that include micromechanical components, and the like.

Wafer 100 is provided with at least a first layer, a substrate layer 110, and a second layer, a dielectric layer 120. As used herein, dielectric layer 120 provides a front-side face of the wafer 100, whereas substrate layer 110 provides a back-side face of wafer 100.

Substrate layer 110 of wafer 100 comprises a substrate material. In some embodiments, substrate layer 110 comprises silicon as substrate material. In some embodiments, substrate layer 110 is substantially made from silicon. In some embodiments, the material in substrate layer 110 is crystalline. In some embodiments, the silicon comprised in substrate layer 110 is crystalline. In some embodiments, the material of substrate layer 110 is essentially monocrystalline.

The dielectric layer of wafer 100 comprises semiconductor devices. In the present example, dielectric layer 120 comprises integrated circuits that comprise circuit elements and coupling elements configured to couple the circuit elements. For example, in some embodiments, some circuit elements are provided as transistors. For example, in some embodiments, some coupling elements are provided as metal lines. In some embodiments dielectric layer 120 comprises dielectric material, for example oxide such as silicon oxide. The integrated circuits are embedded in the dielectric material. In some embodiments, a boundary 130 between substrate layer 110 and dielectric layer 120 is functionally ill-defined, since portions of substrate layer 110 that face dielectric layer 120 may be doped with particles such as ions to establish predetermined semi-conducting or conducting properties in the doped region, or otherwise form part of circuitry essentially provided in dielectric layer 120.

In some embodiments, dielectric layer 120 with the integrated circuits and/or other semiconductor devices embedded in the dielectric material resulted from a process that encompasses one or more of the following: doping to achieve predetermined semi-conducting properties in the doped material; deposition and/or growing of a dielectric material such as an oxide, deposition of metal; deposition of a resist, i.e., a light-sensitive protective material; curing of the resist; shining radiation that affects the resist through a mask; refractive or diffractive; to selectively expose the resist to the radiation; selective removal of resist, dry etching to selectively remove oxide; wet etching of resist to reveal patterned oxide; cleaning. The process and its variants can have been used repeatedly when forming the integrated circuit.

Dielectric layer 120 comprises several so-called active portions 121, herein also referred to as chip areas. In some embodiments each active portion 121 comprises at least one die-semiconductor device such as the die-integrated circuit. Active portion 121 is destined to be separated from other active portions 121 in a dicing process that will be described below, so as to obtain a plurality of dice. Thus, one die, together with the respective die-integrated circuit formed with the die, forms one integrated circuit chip, whereby the plurality of dice provides a plurality of integrated circuit chips. Generally, depending on the die-semiconductor product formed with the die, the plurality of dice provides a plurality of semiconductor device products.

In some embodiments active portions 121 comprise a crack stop barrier provided in the periphery of the die-semiconductor device, i.e. in the present example, the die-integrated circuit. In some embodiments the crack stop barrier, at least partially, surrounds the die-integrated circuit and serves to stop cracks originating at a die boundary or die wall to propagate towards the die-integrated circuit. A crack reaching the die-integrated circuit can impair the functionality of the die-integrated circuit, since a crack can severely modify electrical properties of circuit elements affected by the crack. For example, instead of providing a resistance close to zero, a line that is broken may have a conductivity close to zero.

Active portions 121 are spaced apart from one another by dicing portions 122. Herein, a dicing portion area may also be referred to as dicing area, dicing channel, kerf channel, scribe line portion, dicing street, scribe lane, and sawing line. It should be understood that, even though the example shows dicing areas to form a rectangular array pattern, the present disclosure is neither limited to any rectangular array pattern nor to any dicing areas formed as straight lines. Some embodiments implement dicing patterns of arbitrary geometry. The arbitrary geometry can be predetermined by design or result from a certain degree of randomness allowed by process and/or mask design. Techniques disclosed herein can be used, for example, to provide curvature in the dicing street, or patterns to manufacture dice from the wafer with at least two dice of different size.

In some embodiments, dicing portions 122 comprise structural elements and/or circuitry for use in measurement and/or wafer testing. Herein, in particular, such circuitry provided on the wafer that is other circuitry than die integrated circuitry is also referred to as wafer-circuitry. Since, at least in some embodiments, use of the wafer-circuitry is limited to the existence of the wafer in one piece, this circuitry, along with the structural elements in the dicing portions, may be lost in dicing of the wafer.

Figure 2:
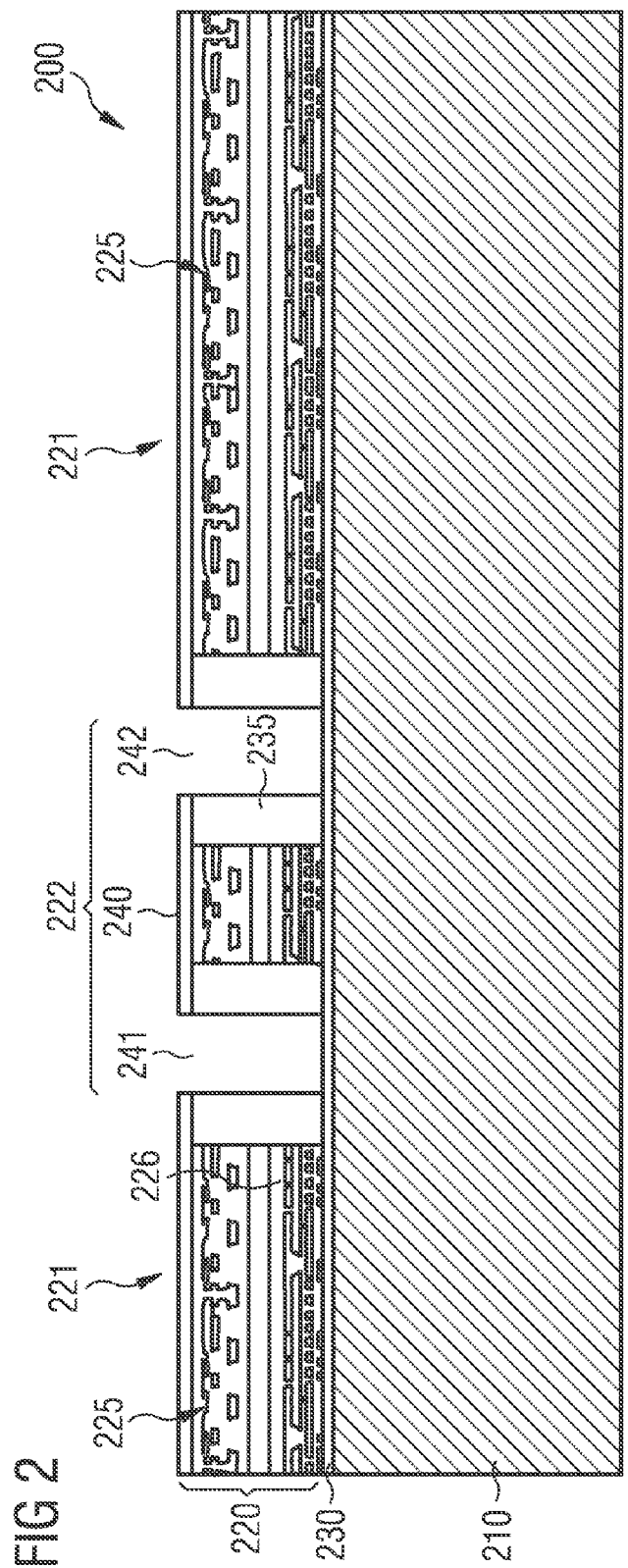
FIG. 2 is a diagram schematically illustrating a sectional side view of a portion of a wafer undergoing processing according to some implementations.

FIG. 2 is a diagram schematically illustrating a sectional side view of a portion of a wafer 200, similar to wafer 100 shown in FIG. 1, undergoing processing according to some implementations. Wafer 200 comprises a substrate 210 and a dielectric layer 220 having active portions 221 that are separated by a dicing portion 222. Active portions 221 respectively comprise a die-integrated circuit 225 and/or another semiconductor device embedded in a dielectric and in at least a portion of substrate 210. It should be noted that, herein, the figures show substrate 210 without any detail regarding die integrated circuit 225. The die-integrated circuit as exemplary die-semiconductor device is thus indicated by an arrow that, for the purpose of exemplary illustration, generally points at some structural elements of integrated circuit 225. In particular, integrated circuit 225 comprises metal lines 226. In the exemplary embodiment shown, wafer 200 comprises a boundary layer 230 between substrate 210 and dielectric layer 220. However, this is only an example. In some implementations (not shown) there is no boundary layer between substrate 210 and dielectric layer 220.

Dicing portion 222 comprises a pair of trenches 241 and 242 where, according to some implementations, dielectric material is essentially completely removed down to a floor provided by a surface of substrate 210, or by coating of substrate 210 that faces dielectric layer 220 or by some other boundary layer 230 between substrate 210 and dielectric layer 220. While herein the boundary layer 230 is shown as a continuous layer; it should be understood that boundary layer 230 can be discontinuously structured. It should also be understood that the skilled person can contemplate other implementations where the removal of dielectric material from the trenches in a direction towards substrate 210 does not extend all the way to boundary layer 230, or where the removal extends beyond boundary layer 230 and encompasses some material of substrate 210. Dicing portion 222 further comprises a ridge 240 that is provided between the pair of trenches 241 and 242. Ridge 240 comprises integrated circuitry and/or other structures configured, for example, for use in testing the wafer, herein collectively referred to as "wafer-circuitry", and embedded in dielectric material 235 of dielectric layer 220. In particular, in some embodiments, ridge 240 comprises metal structures that are resistive to the kind of etching that is used to form the pair of trenches 241 and 242 in dielectric layer 220.

Figure 3:
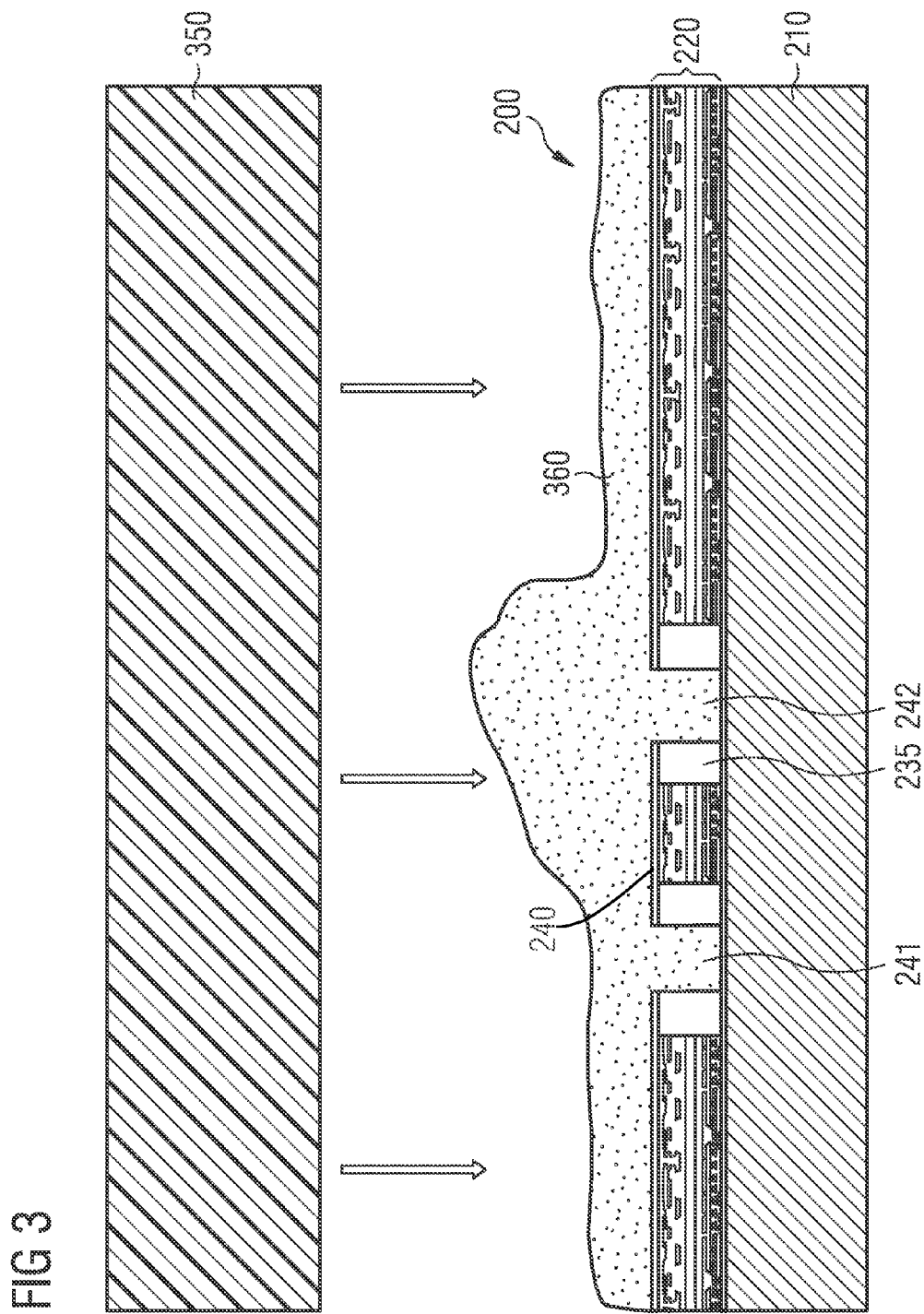
FIG. 3 is a diagram schematically illustrating a sectional side view of a portion of a wafer undergoing processing according to some implementations.

FIG. 3 is a diagram schematically illustrating a sectional side view that illustrates a portion of wafer 200 undergoing processing according to some implementations. Compared with the illustration of wafer 200 in FIG. 2, wafer 200 is about to be glued to a carrier plate 350 that is depicted in FIG. 3 looming above wafer 200. Accordingly, glue 360 is spread across dielectric layer 220. In particular, glue 360 also fills trenches 241 and 242 and covers otherwise open faces of ridge 240.

Figure 4:
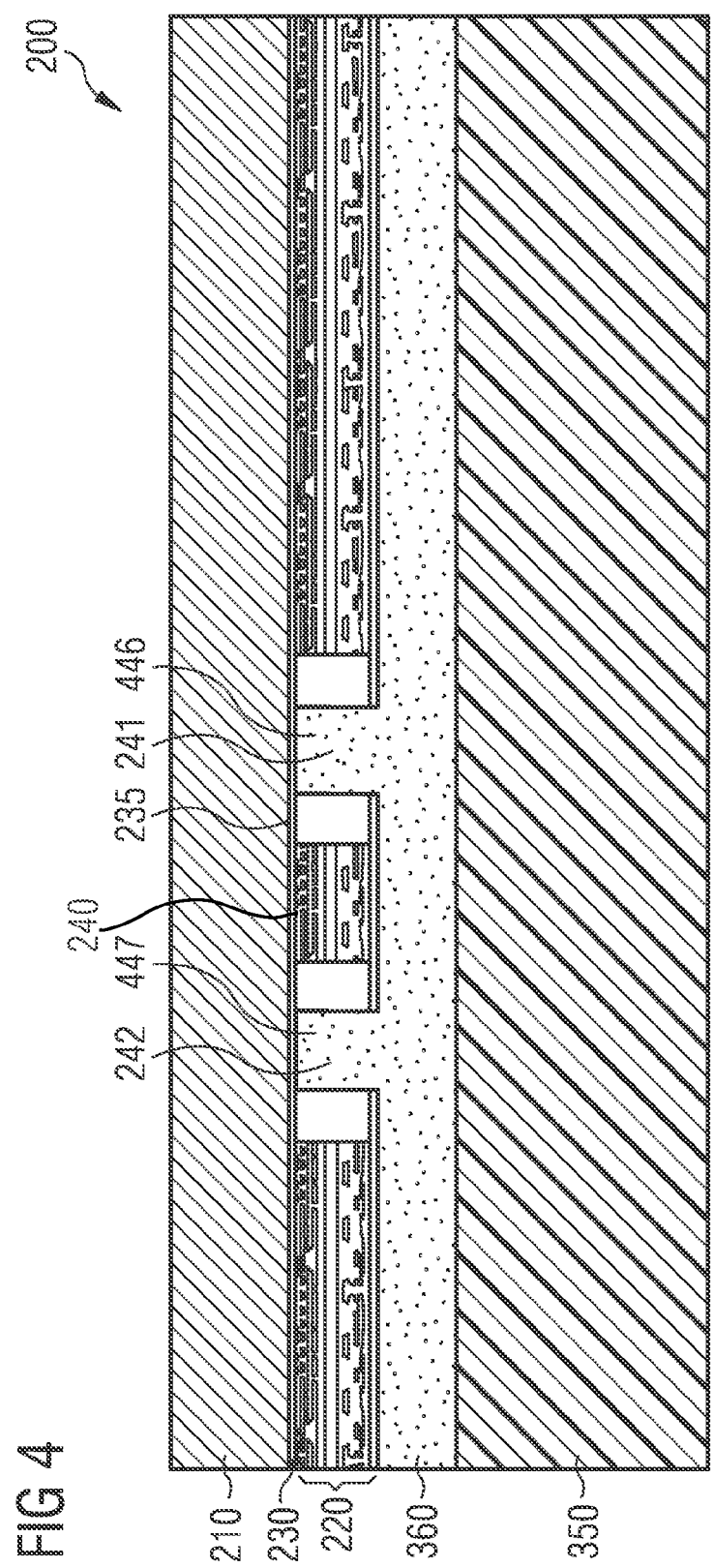
FIG. 4 is a diagram schematically illustrating a sectional side view of a portion of a wafer undergoing processing according to some implementations.

FIG. 4 is a diagram schematically illustrating a sectional side view of a portion of wafer 200 undergoing processing according to some implementations. In FIG. 4 wafer 200 is shown flipped such that substrate 210 faces up, while dielectric layer 220 faces down. Compared with the illustration of wafer 200 in FIG. 3, wafer 200 is now glued to carrier plate 350. Accordingly, a layer of glue 360 is provided between dielectric layer 220 and carrier plate 350. In some embodiments (not illustrated), an adhesive tape is provided between the dielectric layer and the carrier plate in order to affix the carrier plate to the dielectric layer. In particular, in trenches 241 and 242, respective glue ridges 446 and 447 are formed that stick side by side to ridge 240.

Further, compared with the implementation illustrated in FIG. 2, in implementations as illustrated in FIG. 4, in some embodiments, substrate 210 is thinner. In some implementations, wafer 200 is thus ready to perform a dicing etch on wafer 200.

Figure 5:
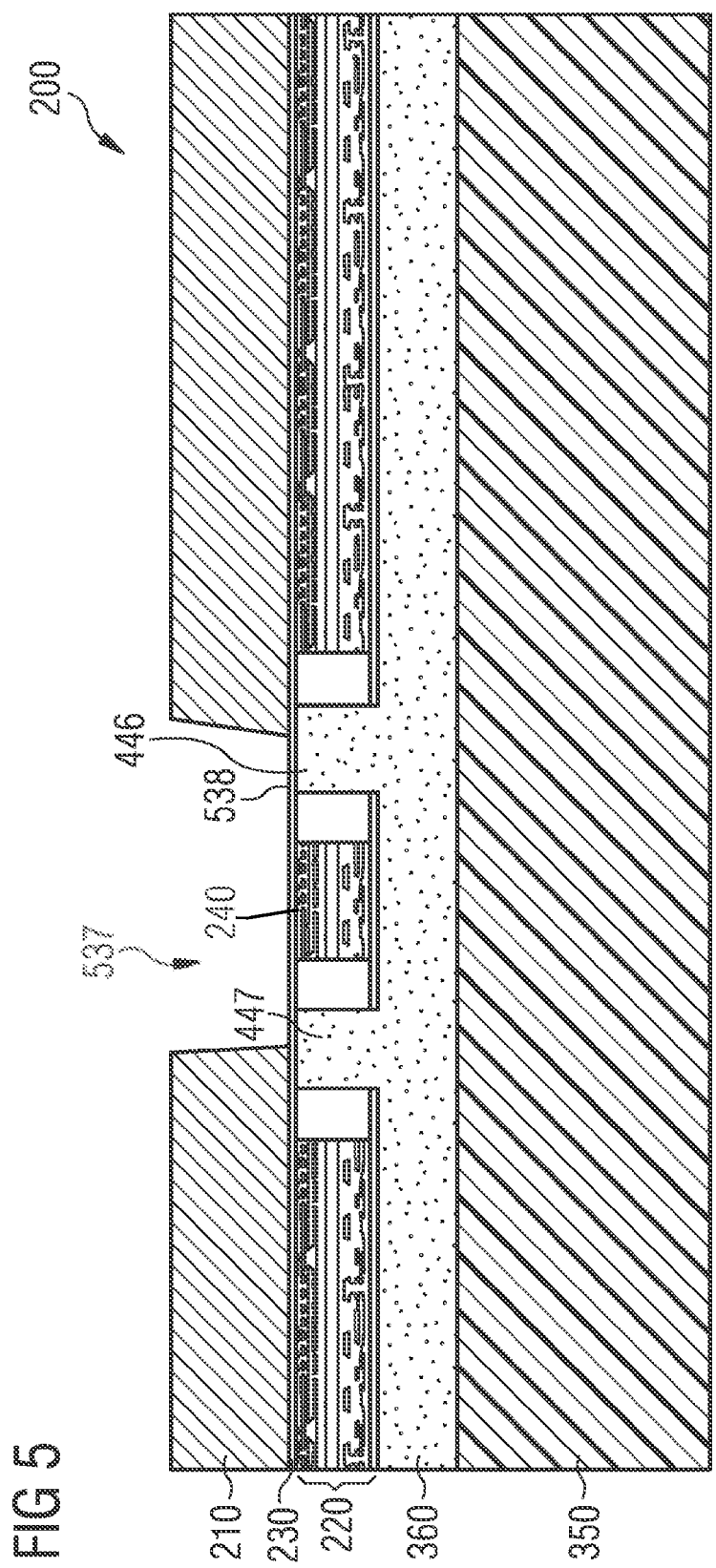
FIG. 5 is a diagram schematically illustrating a sectional side view of a portion of a wafer undergoing processing according to some implementations.

FIG. 5 is a diagram schematically illustrating a sectional side view of a portion of wafer 200 undergoing processing according to some implementations. Compared with the illustration of wafer 200 in FIG. 4, wafer 200 comprises a dicing trench 537 that extends through substrate 210 down to boundary layer 230. Essentially, a floor 538 of dicing trench 537 extends across ridge 240 and also across at least a portion of glue ridges 446 and 447 formed side-by-side with ridge 240. Thus, in other words, dicing trench 537 projects onto portions of both trenches 241, 242 of the pair of trenches 241, 242 that were shown to be formed in dicing portion 222 between active portions 221 of wafer 200 as illustrated, for example, in FIG. 2.

Figure 6:
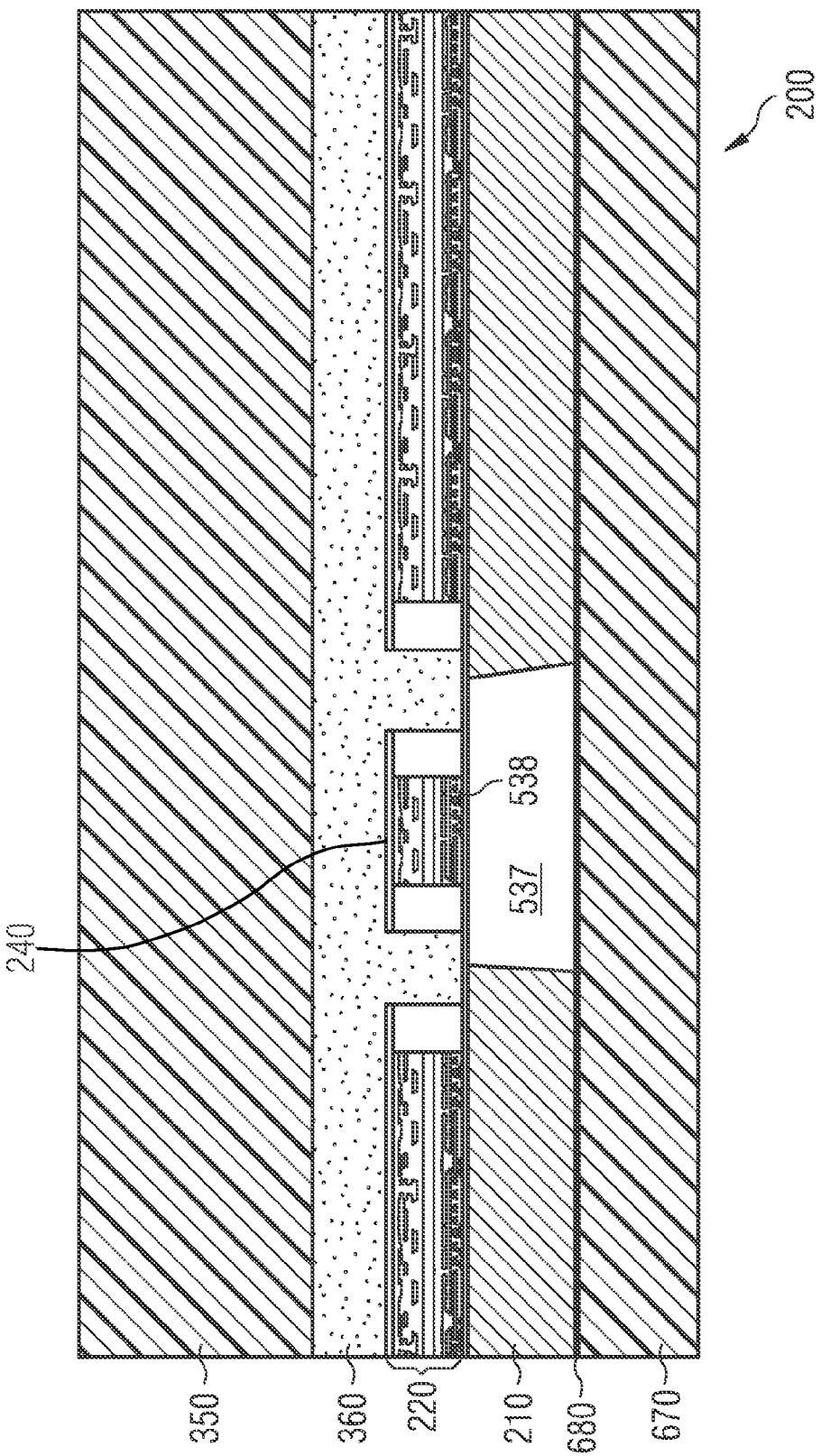
FIG. 6 is a diagram schematically illustrating a sectional side view of a portion of a wafer undergoing processing according to some implementations.

FIG. 6 is a diagram schematically illustrating a sectional side view of a portion of wafer 200, prepared as shown in FIG. 5, undergoing processing according to some implementations. Compared with the illustration of wafer 200 in FIG. 5, substrate 210 of wafer 200 is stuck to an adhesive tape comprising a flexible carrier layer 670 and an adhesive layer 680. Further compared with the illustration of wafer 200 in FIG. 5, the arrangement is flipped upside down and, according to some implementations, thus prepared for removal of carrier plate 350 and the layer of glue 360.

Figure 7:
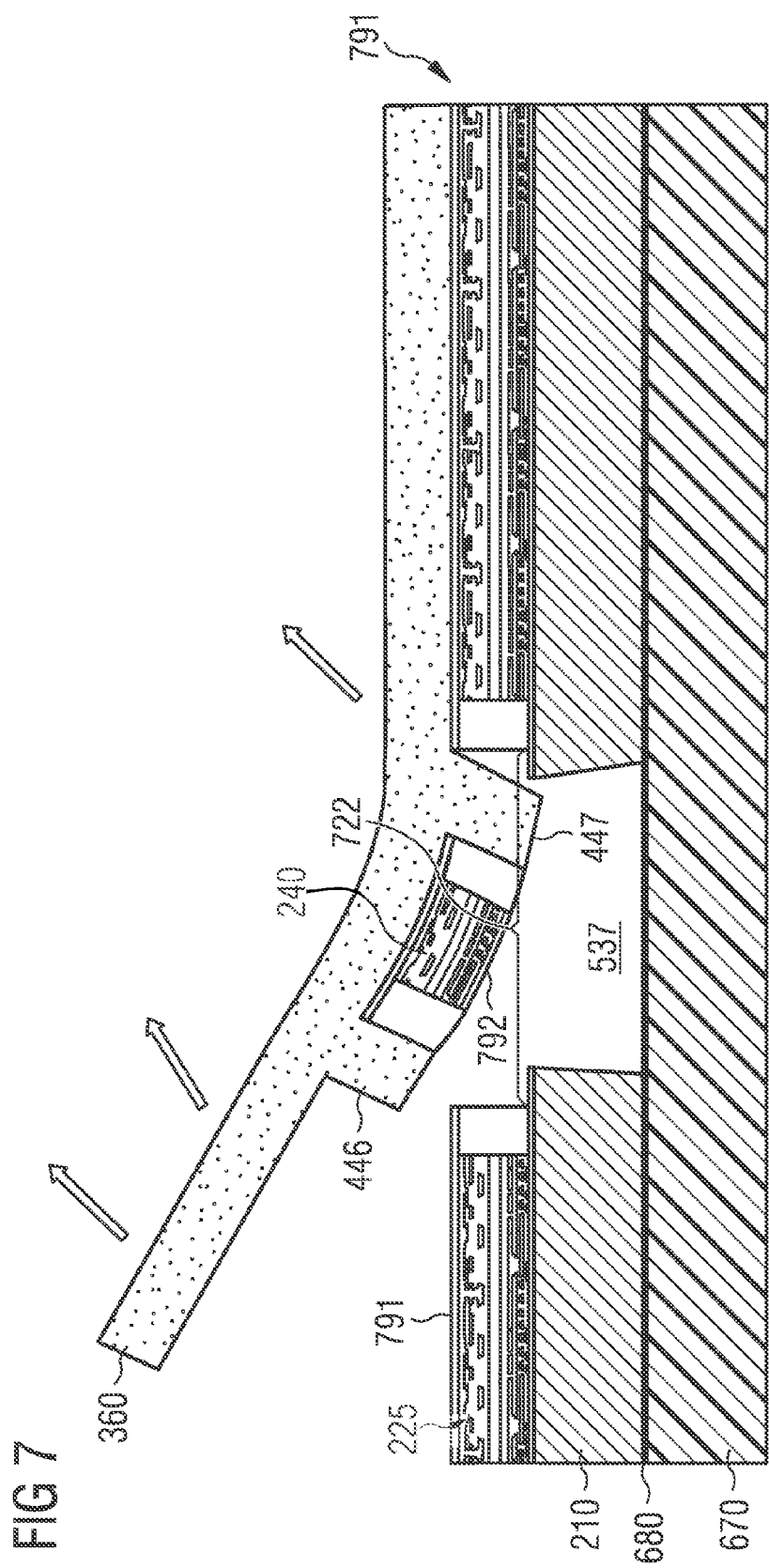
FIG. 7 is a diagram schematically illustrating a sectional side view of portions of dice originating from a wafer according to some implementations.

FIG. 7 is a diagram schematically illustrating a sectional side view of portions of dice 791 that are stuck to adhesive layer 680 of the adhesive tape as shown in FIG. 6. Dice 791 originate from wafer 200 (not shown in FIG. 7) and correspond to the dice-to-be, i.e. in the present example, to active portions 221 of wafer 200. Dice 791 respectively comprise die-semiconductor devices such as, in the exemplary embodiment shown, die-integrated circuit 225. Further, a lost part 792 that includes wafer-circuitry is shown to be removed from a dicing channel 722 formed between dice 791. In some implementations, dice 791 are thus prepared for pick up, for example, to be respectively set to lead frames (not shown in FIG. 7).

Figure 8:
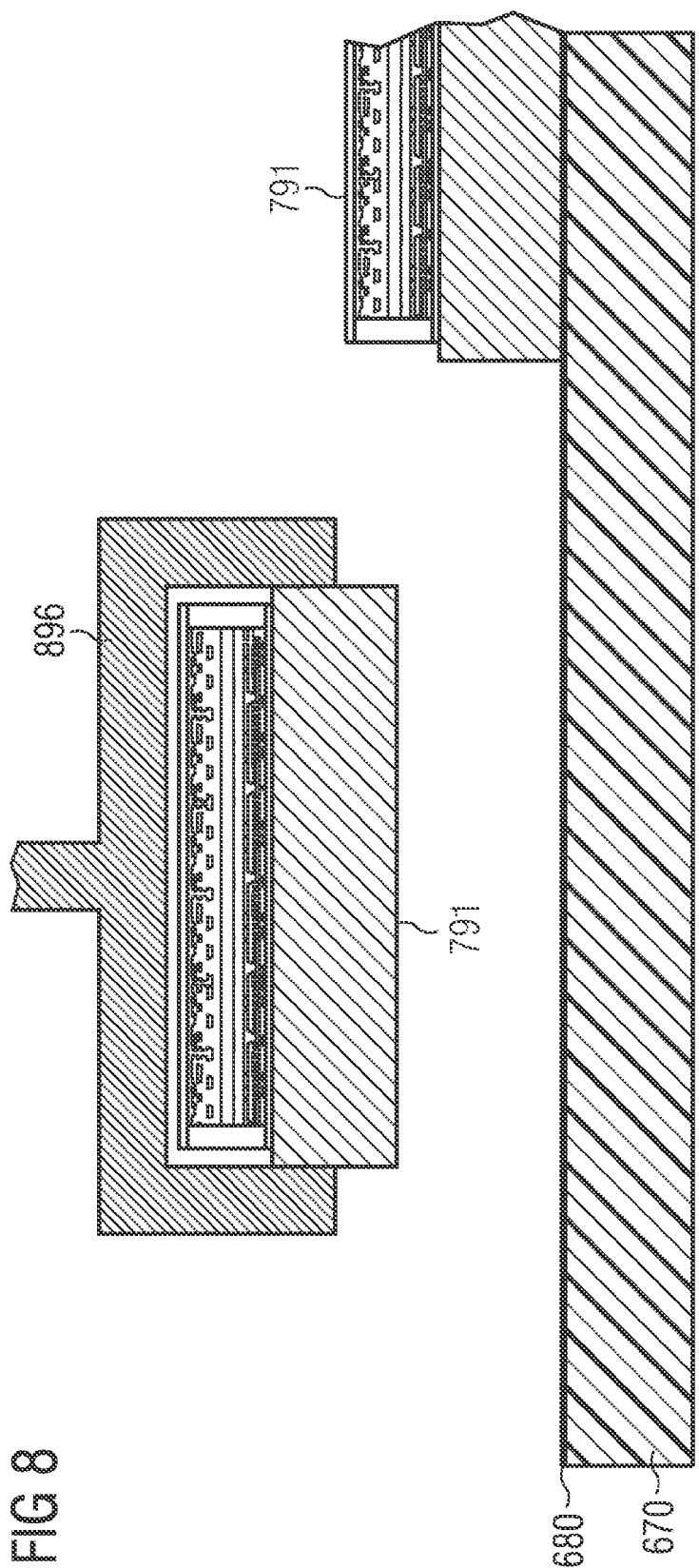
FIG. 8 is a diagram schematically illustrating a sectional side view of dice according to some implementations.

FIG. 8 is a diagram schematically illustrating a sectional view of dice according to some implementations. Die 791 is held by a pickup device 896 according to some implementations. Pickup device 896 illustrated in FIG. 8 is merely an example. The person skilled in the art may contemplate use of other pickup devices, for example use of a low-pressure pickup device that is configured to suck the die surface. The person skilled in the art may also contemplate not to use any pickup device, for example, in a case where bare dice are provided as bulk products. Pickup device 896 is configured to grab die 791 while die 791 is affixed to flexible carrier layer 670 of the adhesive tape by adhesive layer 680. In some implementations, pickup device 896 is further configured to lift die 791 from the adhesive tape. In some embodiments, pickup device 896 is configured to set die 791, for example, to a lead frame (not shown in FIG. 8). In other implementations, pickup device 896 may set die 791 to a flange, to a printed circuit board, to a heap of singularized dice, for example, to be used as bare dice, etc. In some implementations (not illustrated in FIG. 8), pickup device 896 is configured to simultaneously grab a plurality of dice 791 and to lift dice 791 from the adhesive tape.

FIG. 9 is a flow chart that illustrates an exemplary flow of actions in a process used to effect dicing according to some implementations. The process can, for example, be performed on wafer 100 as described above with reference to FIG. 1. Exemplary implementations of the dicing process will now be explained with reference to FIGS. 2 to 8.

At S 10, etching, for example dry etching, is performed on the front-side of wafer 200. More particularly, in some embodiments, dry etching is performed to etch the pair of trenches 241 and 242 in dicing portion 222 that is provided between active portions 221. It should be understood that dry etching is merely an exemplary method to form the pair of trenches 241 and 242. This disclosure should not be understood to be limited to use of the dry etching process to form the pair of trenches 241 and 242. Rather, the person skilled in the art can use another method to form the pair of trenches 241 and 242 such as wet etching. As explained above, the person skilled in the art can contemplate a suitable depth of trenches. In some implementations, as shown in FIG. 2, removing dielectric material to form the pair of trenches 241 and 242 is performed down to a floor provided by a surface of substrate 210, or by a coating of substrate 210 that faces dielectric layer 220 or by some other boundary layer 230 between substrate 210 and dielectric layer 220. In other embodiments, not shown in FIG. 2, removing dielectric material from the trenches 241, 242 in a direction towards substrate 210 is not performed all the way to boundary layer 230. In some embodiments, not shown in FIG. 2, removing dielectric material from the trenches 241, 242 in a direction towards substrate 210 is performed beyond boundary layer 230 and encompasses some material of substrate 210. While active portions 221 respectively comprise die integrated circuit 225 embedded in the dielectric, ridge 240 that is formed between trenches 241 and 242, in some embodiments, comprises metal lines embedded in dielectric material 235 of dielectric layer 220.

At S 20, glue 360 is spread across dielectric layer 220. An exemplary implementation is illustrated in FIG. 3. In an alternate embodiment, adhesive tape is used instead of glue. In particular, the glue 360 also fills trenches 241, 242. Carrier plate 350 is pressed towards the arrangement with dielectric layer 220 covered by glue 360. Thus, carrier plate 350 is glued to the wafer front-side. A layer of glue 360 is thus formed between dielectric layer 220 and carrier plate 350. In particular, as shown in FIG. 4, in trenches 241 and 242, respective glue ridges 446 and 447 are formed that stick side by side to ridge 240. In some embodiments, the arrangement with wafer 200 is flipped as illustrated in FIG. 4. Thus, substrate 210 faces up.

At S 30, in some embodiments, wafer thinning is performed on substrate 210 For example, an etch or an abrasive method is performed on substrate 210 whereby substrate material is removed across the back-side of substrate 210. As in the exemplary illustration of FIG. 4, in some embodiments, substrate 210 is thinner than before. In some implementations, wafer 200 is thus ready to perform a dicing etch on wafer 200.

At S 40, in some embodiments dicing of wafer 200 is performed. In some implementations, as in the example illustrated in FIG. 5, plasma dicing, in particular, a Bosch etch is performed on the wafer back-side, i.e., on that face of substrate 210 that, in the illustrated example, is not covered by dielectric layer 220. It should be understood that in other implementations, both faces of the substrate can be covered by a dielectric layer. The person skilled in the art can contemplate to use a process other than Bosch etching in order to perform etch dicing. Plasma dicing forms a dicing trench 537 that, in some implementations, extends all through wafer substrate 210, in the example, down to boundary layer 230 to a floor 538 of dicing trench 537. In some implementations, floor 538 spans ridge 240 and also at least a portion of glue ridges 446 and 447 that are formed side-by-side with dielectric ridge 240. Thus, in other words, dicing trench 537 projects onto portions of both trenches of the pair of trenches 241, 242 that are formed between active portions 221 of wafer 200 as illustrated, for example, in FIG. 2. In some implementations, dicing trench 537 in substrate 210 is formed prior to forming the pair of trenches 241, 242 in dielectric layer 220. In some embodiments, deposition of a hard mask, in particular when combined with an additional photo lithography process to pattern the hard mask at least in the scribe line area/portion, for example, precedes other wafer processing described already. At least one effect can be that etching, for example dry etching, may not need to be performed on the front-side of wafer 200.

At S 50, in some implementations, the arrangement is mounted on carrier tape having flexible carrier layer 670 provided with adhesive layer 680 as in the example shown in FIG. 6. In some embodiments, again, the arrangement is flipped upside down and thus prepared for removal of the layer of glue 360.

At S 60, carrier plate 350 is removed. In some implementations, carrier plate 350 is removed from the layer of glue 360 such that the layer of glue 360 is left in place above dielectric layer 220 as shown in FIG. 7. In some implementations carrier plate 350 is removed together with the layer of glue 360 (not shown in the figures). Still at S 60, the layer of glue 360 is removed. As in the example illustrated in FIG. 7, dice 791 are left stuck to adhesive layer 680 of the adhesive tape whereas lost parts 792 are lifted together with glue ridges 446 and 447. Dice 791 correspond to active portions 221 of wafer 200 and comprise the die-semiconductor devices such as die-integrated circuit 225. In contrast, lost part 792 includes wafer-circuitry that is not needed any more.

At S 70, in some implementations, dice 791 are picked up, for example as illustrated in FIG. 8, grabbed and held by a pickup device 896, to be set to lead frames. The pickup device thus removes the dice 791, in some implementations, one by one, in other implementations a plurality of dice at one time, from adhesive layer 680 of the adhesive tape.

Further variants and embodiments according to various aspects are disclosed. Below, exemplary aspects and embodiments of techniques according to the present disclosure may be discussed with reference to integrated circuits. However, as explained above, it should be understood that techniques according to the present disclosure can be used in manufacturing semiconductor devices such as integrated circuits, transistors, capacitances, inductances, mechanical devices, microelectromechanical systems (MEMS), etc., to merely state a few examples.

In a first aspect the invention encompasses a method for use in manufacturing semiconductor devices. Thus, for example, the method can form part of manufacturing semiconductor device chips. The method comprises providing a wafer comprising a plurality of die areas each comprising a semiconductor device such as an integrated circuit. In some embodiments a die area comprises a plurality of semiconductor devices. The die areas are dedicated to separate dice and therefore, herein, may also be referred as dice-to-be.

Semiconductor devices that are formed in a die area may herein be referred to as die-semiconductor devices. In other words, reference may herein be made to "die-semiconductor devices" to denote those devices that, originating from the wafer, are to go into semiconductor device products, for example integrated circuit chips to be manufactured, as opposed to other elements or semiconductor devices provided on the wafer, for example for the purpose of testing the wafer, referred to herein as "wafer-circuitry" some of which may be lost after dicing, i.e., after dividing the wafer up into dice.

The die areas are formed on a first face of the wafer. Adjacent die areas are distanced from one another. The method comprises forming, on the first face, between adjacent die areas, a first trench and a second trench that are spaced apart from one another by a ridge. At least one effect can be that the ridge can comprise wafer-circuitry to be lost in dicing. For example, the ridge can comprise structural elements and/or test circuitry configured to be used in measurement and/or test of the wafer. In some embodiments the ridge provides a straight line structure that runs essentially parallel to straight walls of the first and the second trench that may, for example, form boundaries of adjacent die-semiconductor devices provided in die areas of separate dice-to-be.

Some embodiments comprise forming, on a second face of the wafer, a third trench above the ridge. The wording "above" should be understood such that the wafer is flipped first face down. At least one effect can be that the third trench can be formed by plasma etch.

In some embodiments, forming the third trench comprises forming the trench sufficiently wide to project onto a portion of the first trench and onto a portion of the second trench. It should be understood that "project" is used herein in a direction of view that is parallel to a direction of dicing operation, i.e., essentially perpendicular to the wafer's face. At least one effect can be that the third trench can facilitate dicing. In some embodiments the forming the third trench is performed until a third trench floor is in a plane with at least one of a first trench floor and a second trench floor. At least one effect can be that the third trench effectuates a separation of the wafer into adjacent dice that include the die-semiconductor device.

In some embodiments the ridge comprises metal. For example, the ridge can comprises wafer-circuitry, in particular, metal conductor lines and/or vias. In some embodiments the ridge comprises structural elements configured for use in measurements to be performed on the wafer. In some embodiments, the ridge comprises test circuitry configured to test the wafer.

Some embodiments comprise, having formed the first trench and the second trench, setting a first carrier to the first face of the wafer. In some embodiments the first carrier is rigid. At least one effect can be that a carrier wafer can be glued to the first face so as to provide the carrier for the wafer, for example, for use during dicing. Some embodiments comprise gluing the first carrier to the first face of the wafer. Some alternate embodiments comprise providing an adhesive tape between the first carrier and the first face of the wafer prior to forming the third trench. Some embodiments comprise thinning the wafer at the second face prior to forming the third trench. Some embodiments comprise, having thinned the wafer, performing at least one in a group of acts on the second face consisting of: ion implanting, chemical mechanical polishing, damage removal, dielectric layer deposition, backside metal deposition. The person skilled in the art can devise a sequence as needed, wherein the at least one act is performed before or after having formed the third trench.

Some embodiments comprise, having formed the third trench, setting a second carrier to the second face of the wafer. In some embodiments the second carrier is flexible. For example, an adhesive tape can be stuck to the wafer, in particular, for use during removal of the first carrier. At least one effect can be that the adhesive tape keeps the dice in place while the first carrier is removed. In some embodiments an adhesive strength of the adhesive tape on the second surface is stronger than an adhesive strength of the glued first carrier on the first surface. At least one effect can be that the first carrier and glue can be removed while the singularized dice stick to the adhesive of the second carrier.

In some embodiments forming the first trench and the second trench is performed using dry etching. At least one effect can be that mechanical stress on the wafer is kept sufficiently low to suppress cracking. In some embodiments forming the third trench is performed using plasma etching. In some embodiments forming the third trench is performed using Bosch etching.

In another aspect the invention encompasses an apparatus for use in manufacturing semiconductor devices. The apparatus is configured to hold a wafer comprising a plurality of die areas that may comprise semiconductor devices such as integrated circuits. The die areas are formed on a first face of the wafer, wherein adjacent die areas are distanced from one another. The wafer further comprises, on the first face, between adjacent die areas, a first trench and a second trench. In some embodiments the apparatus is configured to form the first trench and/or the second trench. In some embodiments the apparatus is configured to perform the forming a first trench and a second trench using dry etching. The first trench and the second trench are spaced apart from one another by a ridge. At least one effect is that the ridge can comprise wafer-circuitry to be lost in dicing. For example, the ridge can comprise test circuitry configured to test the wafer.

In some embodiments the apparatus is configured to form, on a second face of the wafer, a third trench above the ridge. In some implementations the apparatus is configured to perform a plasma etch such as a Bosch etch in order to form the third trench. In some embodiments the third trench is sufficiently wide to project onto a portion of the first trench and onto a portion of the second trench. At least one effect can be that the third trench can facilitate dicing. In some embodiments the apparatus is configured to perform the forming the third trench until a third trench floor is in a plane with at least one of a first trench floor and a second trench floor. At least one effect can be that the third trench effectuates a separation of the wafer into adjacent dice including the respective die-semiconductor device. In some embodiments the ridge comprises metal. At least one effect can be that the ridge can comprise wafer-circuitry. For example, the ridge can comprise test circuitry configured to test the wafer.

In some embodiments the apparatus is configured to set, having formed the first trench and the second trench, a first carrier to the first face of the wafer. In some embodiments the first carrier is rigid. In some embodiments the apparatus is configured to glue the first carrier to the first face of the wafer. In some implementations, the apparatus is configured to provide an adhesive tape between the first carrier and the first face of the wafer. In some embodiments the apparatus is configured to thin the wafer prior to forming the third trench. In some embodiments the apparatus is configured to perform, having thinned the wafer, at least one step of the steps: ion implanting, chemical mechanical polishing, damage removal, dielectric layer deposition, backside metal deposition. The at least one step is performed before and/or after having formed the third trench. In some embodiments the apparatus is configured to set, having formed the third trench, a second carrier to the second face of the wafer. In some embodiments the second carrier is flexible and has an adhesive.

In still a further aspect the invention encompasses a wafer comprising a plurality of die areas each comprising a semiconductor device. The die areas are formed on a first face of the wafer. In some embodiments, the die areas each are a separate portion of wafer that is a dice-to-be. For example, each die-to-be, once separate from other dice-to-be, is a die to provide a semiconductor device product. Adjacent die areas are distanced from one another. On the first face, between adjacent die areas, a first trench and a second trench are spaced apart from one another by a ridge. The wafer further comprises, on a second face, a third trench. In some embodiments, the third trench is sufficiently wide to project onto a portion of the first trench and the second trench. At least one effect is that the third trench provided on the second face of the wafer is aligned with the first trench and the second trench provided on the first face of the wafer.

In still a further aspect the invention encompasses a semiconductor device die. A first face portion of the die comprises a semiconductor device at least partially embedded in a dielectric material. A second face portion of the die consists of a semiconductor crystal. As used herein the word "consisting" encompasses "substantially consisting" and can include accidental and/or other impurities of the crystal, for example doped regions or other sections that have functional impurities. The die has, in a plane with a boundary between the dielectric material and the second face portion, a semiconductor crystal surface surrounding an area covered by the first face portion. In some embodiments, the semiconductor device is partially embedded in the semiconductor crystal. In some embodiments, the die comprises a boundary layer that is provided between the dielectric material and the semiconductor crystal surface.

In yet a further aspect the invention encompasses a computer-readable medium holding instructions that, when executed, cause one or more processors to perform acts of a method of control of a manufacturing tool. The method comprises providing a wafer comprising a plurality of die areas. The die areas are formed on a first face of the wafer and may each hold one or more semiconductor devices. Adjacent die areas are distanced from one another. The method comprises, on the first face, between adjacent die areas, forming a first trench and a second trench spaced apart from one another by a ridge. At least one effect can be that the ridge can comprise wafer-circuitry that is to be lost in dicing. For example, the ridge can comprise test circuitry configured to test the wafer. In some embodiments the ridge provides a straight line structure that runs parallel to straight walls of the first and the second well that form boundaries of adjacent dice-to-be. In some embodiments the method comprises, on a second face of the wafer, forming a third trench above the ridge. At least one effect can be that the third trench can be aligned with the first trench and the second trench provided on the first face of the wafer so as to follow the first trench and the second trench on the second face of the wafer. In some implementations, the method performed when executing the code stored on the medium comprises using a plasma etch procedure to form the third trench. In some implementations, the method performed when executing the code stored on the medium comprises using a Bosch etch procedure to form the third trench. In some embodiments the third trench is sufficiently wide to project onto a portion of the first trench and on a portion of the second trench. At least one effect can be that the third trench can facilitate dicing.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. For example, the third trench above the ridge and sufficiently wide to project onto a portion of the first trench and onto a portion of the second trench can be effectuated by forming a third and a fourth trench that essentially project onto the first and the second trench, respectively. In some embodiments, the third and the fourth trench co-operate with the first and the second trench to provide the effect of the third trench being sufficiently wide to project onto a portion of the first trench and onto a portion of the second trench.

Other permutations and combinations of the above-disclosed concepts are also contemplated as falling within the scope of the disclosure. The disclosure includes all such modifications and alterations and is limited only by the scope of the following claims. In particular having regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure.

While a particular feature of the disclosure may have been disclosed with respect to only one of several implementations, such feature may be combined with one or more other features of the other implementations as may be desired and advantageous for any given or particular application.

It is intended that this invention be limited only by the claims and the equivalents thereof.

Exemplary implementations/embodiments discussed herein may have various components collocated; however, it should be appreciated that the components of the arrangements may be combined into one or more apparatuses.

The implementations herein are described in terms of exemplary embodiments. However, it should be appreciated that individual aspects of the implementations may be separately claimed and one or more of the features of the various embodiments may be combined.

In some instances, well-known features are omitted or simplified to clarify the description of the exemplary implementations.

In the above description of exemplary implementations, for purposes of explanation, specific numbers, materials configurations, and other details are set forth in order to better explain the invention, as claimed. However, it will be apparent to one skilled in the art that the claimed invention may be practiced using different details than the exemplary ones described herein.

The inventors intend the described exemplary embodiments/implementations to be primarily examples. The inventors do not intend these exemplary embodiments/implementations to limit the scope of the appended claims. Rather, the inventors have contemplated that the claimed invention might also be embodied and implemented in other ways, in conjunction with other present or future technologies.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, the term 'or' is intended to mean an inclusive 'or' rather than an exclusive 'or.' That is, unless specified otherwise or clear from context, 'X employs A or B' is intended to mean any of the natural inclusive permutations. That is, if X employs A; X employs B; or X employs both A and B, then 'X employs A or B' is satisfied under any of the foregoing instances.

As used herein, the articles 'a' and 'an' should generally be construed to mean 'one or more,' unless specified otherwise or clear from context to be directed to a singular form.

The order in which the embodiments/implementations and methods/processes are described is not intended to be construed as a limitation, and any number of the described implementations and processes may be combined.

As used herein, the terms 'coupled' and 'connected' may have been used to describe how various elements interface. Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, directional terminology, such as 'top', 'bottom', 'front', 'back', 'leading', 'trailing', etc., is used with reference to the orientation of the figure(s) being described.

As used herein, terms such as 'first', 'second', and the like, are also used to describe various elements, regions, sections, etc. and are also not intended to be limiting.

As used herein, the wording 'information associated with X' and the wording 'information indicative of X' are used as synonyms that mean the information can be used in determining X. In some embodiments the information is X itself, in some embodiments, using the information, X can be derived. For example, if a code pattern is to represent the information, knowledge about a rule on how information is coded to form the code pattern is needed in order to derive X.

What is claimed is:

1. A method for use in manufacturing semiconductor devices, comprising:
    providing a wafer comprising a plurality of die areas each comprising a semiconductor device and dedicated to become a separate die, wherein the die areas are formed on a first face of the wafer, and wherein adjacent die areas are spaced from one another;
    forming a first trench and a second trench on the first face between adjacent die areas, the first trench and the second trench spaced apart from one another by a ridge; and
    forming a third trench above the ridge on a second face of the wafer, the second face opposite the first face.

2. The method of claim 1, wherein the third trench is sufficiently wide to project onto a portion of the first trench and onto a portion of the second trench.

3. The method of claim 1, wherein the third trench is sufficiently wide to project onto a portion of the first trench, the method further comprising forming a fourth trench above the ridge on the second face of the wafer, wherein the fourth trench is sufficiently wide to project onto a portion of the second trench.

4. The method of claim 1, wherein forming the third trench comprises forming the third trench until a third trench floor is in a plane with at least one of a first trench floor or a second trench floor.

5. The method of claim 1, wherein the ridge comprises metal.

6. The method of claim 1, wherein the ridge includes test circuitry or test structures.

7. The method of claim 1, comprising attaching a first carrier to the first face of the wafer after forming the first trench and the second trench.

8. The method of claim 7, wherein the first carrier is rigid, the method further adhering the first carrier to the first face of the wafer.

9. The method of claim 1, further comprising thinning the wafer prior to forming the third trench.

10. The method of claim 1, further comprising attaching a second carrier to the second face of the wafer after forming the first trench and the second trench.

11. The method of claim 10, wherein the second carrier is provided as an adhesive tape.

12. The method of claim 1, wherein forming the first trench and the second trench is performed using dry etching.

13. The method of claim 1, wherein forming the third trench comprises performing a plasma etch.

* * * * *